United States Patent
Chang et al.

(10) Patent No.: US 6,894,865 B2
(45) Date of Patent: May 17, 2005

(54) PORTABLE INFORMATION STORAGE DEVICE

(75) Inventors: Chin-Lung Chang, Taipei Hsien (TW); Hui-Ming Chu, Taipei Hsien (TW)

(73) Assignee: Wistron Corp., Taipei Hsien (TW)

( * ) Notice: Subject to any disclaimer, the term of this patent is extended or adjusted under 35 U.S.C. 154(b) by 281 days.

(21) Appl. No.: 10/271,975

(22) Filed: Oct. 17, 2002

(65) Prior Publication Data

US 2004/0017637 A1 Jan. 29, 2004

(30) Foreign Application Priority Data

Jul. 26, 2002 (TW) ...................................... 91211538 U

(51) Int. Cl.$^7$ ............................................. G11B 17/00
(52) U.S. Cl. ................................................. 360/97.01
(58) Field of Search ........................ 360/97.01; 361/56, 361/681, 683, 686, 687

(56) References Cited

U.S. PATENT DOCUMENTS 6,522,534 B1 * 2/2003 Wu ............................. 361/686
2004/0017636 A1 * 1/2004 Chang et al. ............ 360/97.01
2004/0017637 A1 * 1/2004 Chang et al. ............ 360/97.01
2004/0125522 A1 * 7/2004 Chiu et al. .................... 361/56

* cited by examiner

*Primary Examiner*—Tianjie Chen
(74) *Attorney, Agent, or Firm*—Michael Bednarek; Shaw Pittman LLP

(57) ABSTRACT

A portable storage device, such as a USB portable disk drive, comprises a main body and a rotation arm. The main body comprises a storage portion, a connection portion and a back portion. The connection portion comprises a first fastening portion, and the back portion comprises a second fastening portion. The rotation arm is rotatably connected to the main body, and the rotation arm has a third fastening portion corresponding to the first fastening portion and the second fastening portion. When the rotation arm is situated at a first position, the first fastening portion is engaged with the third fastening portion, and the portable storage device is at a status of being housed. When the rotation arm is situated at the second position, the second fastening portion is engaged with the third fastening portion, and the portable storage device is at a status of being used.

11 Claims, 4 Drawing Sheets

PORTABLE INFORMATION STORAGE DEVICE

BACKGROUND OF THE INVENTION

1. Field of the Invention

The present invention relates to a portable storage device, and particularly to a USB portable disk drive (Handy Drive) having no separated covering and being able to be identified from various angles.

2. Description of the Prior Art

As computer technology advances, there is a trend to develop smaller and portable storage devices. Now, various portable storage devices, such as a portable disk drive, are common in the market, and most of them are connected to computers via universal serial bus (USB) interfaces.

FIG. 1 is a perspective diagram of a conventional USB portable disk drive 500. The drive 500 comprises a main body 510 having a storage portion, such as a flash memory, and a covering 520 separated form the main body for covering a USB terminal 515. In addition, the main body 510 further comprises an indicator light 530, such as a light-emitting diode (LED), for showing the operating status of the portable disk drive 500. Before using the USB portable disk drive 500, the user has to remove the covering 520 and plug the USB terminal 515 into a USB socket of the computer. When data is accessed and transmitted between the drive 500 and computer, the indicator light 530 will be turned on so as to show the USB portable disk drive 500 is at a status of being used. When finishing the use of the drive 500, the user can cover the USB terminal 515 with the covering 520 so as to protect the USB terminal 515 and keep it from dust. In addition, a hanging portion (not shown), such as a hooking ring or a hanging hole, can be installed on the main body 510 or the covering 520 so that the user can hang the drive 500 on the neck and carry it with him or her.

However, the conventional USB portable disk drive 500 has the following drawbacks when it is being used and carried.

First, the conventional USB portable disk drive 500 has a separated covering 520 for covering the USB terminal. When the user removes the covering 520 and uses the USB portable disk drive 500, he or she usually lays the covering 520 aside. Therefore, the user tends to lose the covering 520 for the carelessness especially when the USB portable disk drive 500 is repeatedly plugged into the computer for data accessing and taken out from the computer. Losing the covering 520 not only makes it impossible to keep the USB terminal 515 from the dust, but also damages the integrity of the external shape of the USB portable disk drive 500.

Furthermore, the indicator light 530 of the conventional USB portable disk drive 500 is a small LED, and therefore, no matter which position the LED is situated at, the light of the indicator light 530 cannot be easily identified from various angles. Particularly, when the computer system has various peripheral devices, the light emitted by the indicator light 530 will be affected by the surroundings or the other peripheral devices and cannot be easily identified. Consequently, the user tends to misjudge that the data accessing of the USB portable disk drive 500 is finished and then takes out the drive 500 when the drive 500 is still performing the data accessing so that the data accessing will be abnormally interrupted and the data may be damaged.

SUMMARY OF THE INVENTION

Therefore, the objective of the present invention is to provide a portable storage device comprising a main body and a rotation arm installed on the main body for covering. By using the rotation arm, a separated covering is avoided. Furthermore, by installing a light-directing device on the rotation arm, the user can identify the light of the lamp portion from various angles, and the misjudging can be avoided so that the portable storage device will not be taken out when the data accessing is being performed.

The present invention relates to a portable storage device. The portable storage device comprises a main body and a rotation arm. The main body has a storage portion, a connection portion and a back portion. The connection portion has a first fastening portion, and the back portion has a second fastening portion. The rotation arm is rotatably connected to the main body. The rotation arm further comprises a third fastening portion corresponding to the first fastening portion and the second fastening portion. When the rotation arm is situated at a first position, the first fastening portion is engaged with the third fastening portion, and the portable storage device is at a status of being housed. When the rotation arm is situated at the second position, the second fastening portion is engaged with the third fastening portion, and the portable storage device is at a status of being used.

In the portable storage device of the invention, the storage portion can be portable disk drive, and the connection portion can be a universal serial bus (USB) connection portion. Furthermore, the main body can have a lamp portion for showing the operating status of the portable storage device, and the rotation arm can have a light-directing portion for directing the light of the lamp portion to various angles so as to make it easy for the users to identify.

Furthermore, in the portable storage device of the invention, the third fastening portion can be a plurality of protruding portions and the first fastening portion and the second fastening portion can respectively be a plurality of concave portions corresponding to the protruding portions. The third fastening portion also can be a plurality of concave portions and the first fastening portion and the second fastening portion can respectively be a plurality of protruding portions corresponding to the concave portions. Therefore, the third fastening portion can easily and separately engaged with the first fastening portion and the second fastening portion.

Furthermore, the portable storage device of the invention comprises a hanging portion in stalled on the rotation arm. The hanging portion has a plurality of hanging holes so that the user can hang the portable storage device on the neck and carry it with him or her.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
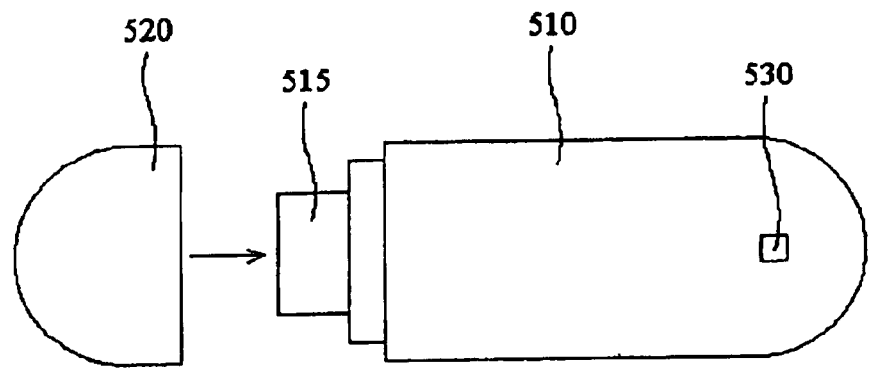
FIG. 1 is a perspective diagram of a conventional USB portable disk drive 500.
Figure 2:
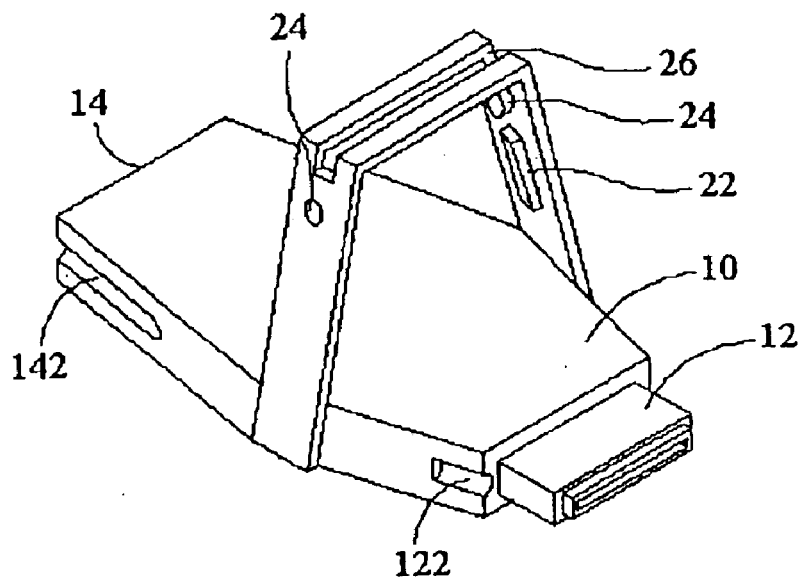
FIG. 2 is a perspective diagram of a portable storage device according to the present invention.
Figure 3:
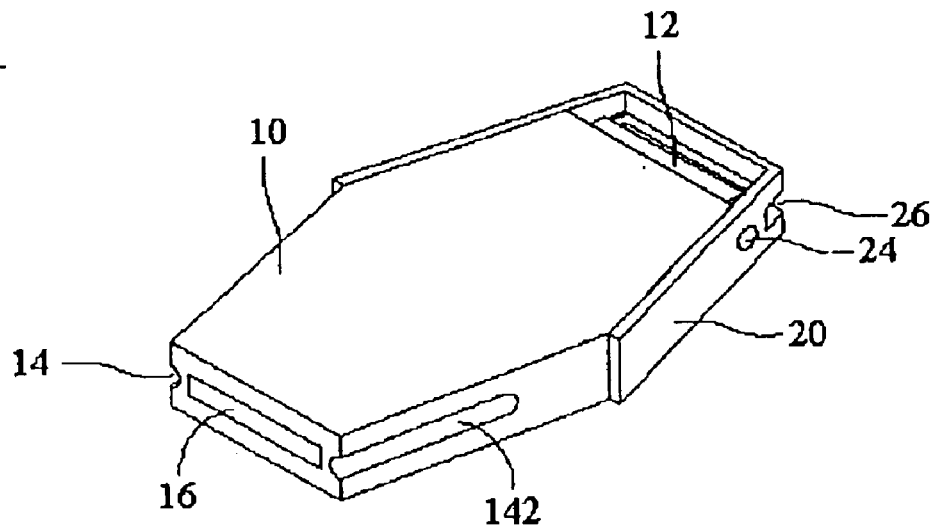
FIG. 3 is a perspective diagram of the portable storage device at a status of being housed.

Please refer to FIG. 2 and FIG. 3. FIG. 2 and FIG. 3 are perspective diagrams of a portable storage device 1 according to the present invention.

As shown in FIG. 2, the portable storage device 1 is a USB portable disk drive. The device 1 comprises a main body 10 and a rotation arm 20. The main body 10 has a storage portion, a connection portion 12 and a back portion 14. The storage portion is installed inside the main body 10 for storing data. The connection portion 12 is a USB connection portion, and has a first fastening portion 122. The back portion 14 has a second fastening portion 142. The rotation arm 20 is rotatably connected to the main body 10. The rotation arm 20 comprises a third fastening portion 22 corresponding to the first fastening portion 122 and the second fastening portion 142. In this embodiment, the third fastening portion 22 is a plurality of protruding portions and the first fastening portion 122 and the second fastening portion 142 are a plurality of concave portions corresponding to the protruding portions, respectively. Therefore, each of the protruding portions is respectively engaged with one concave portion so that the rotation arm 20 can be situated at different positions relative to the main body 10.

As shown in FIG. 3, in this embodiment, the back portion 12 of the main body 10 comprises a lamp portion 16, such as a light emitting diode (LED), for showing the operating status of the portable storage device 1. The rotation arm 20 has a light-directing portion 24, such as a translucent light-directing slice, for directing the light of the lamp portion 16 to various angles so as to make it easy for the users-to identify whether the lamp portion 16 is turned on or off.

In addition, the rotation arm 20 further comprises a hanging portion. As shown in FIG. 2 and FIG. 3, two hanging holes 24 are separately installed on the right and left sides of the rotation arm 20. Therefore, the user can hang the portable storage device 1 on the neck and carry it with him or her.

Figure 4A:
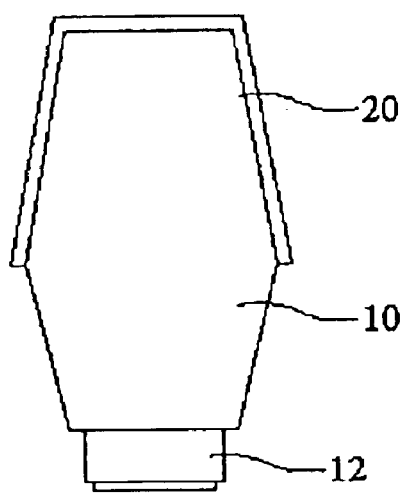
FIG. 4a is a perspective diagram of the portable storage device at a status of being used.
Figure 4B:
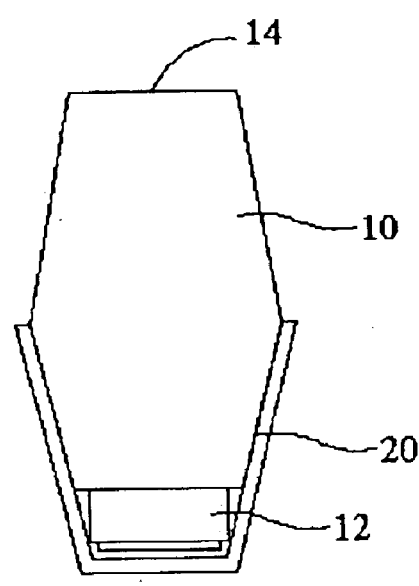
FIG. 4b is a perspective diagram of the portable storage device at a status of being housed.

In this embodiment, the rotation arm 20 is rotatably connected to the main body 10, and as shown in FIGS. 4a and 4b, when the rotation arm 20 is situated at different positions, the portable storage device 1 will be at different operating statuses.

FIG. 4a is a perspective diagram of the portable storage device 1 at a status of being used. When the rotation arm 20 is rotated to the back of the main body 10 and covers the back portion 14, the rotation arm 20 is situated at a second position for being used, and the protruding portions of the third fastening portion 22 are engaged with the concave portions of the second fastening portion 142. The connection portion 12 is exposed, and the portable storage device 1 is at the status of being used. The lamp portion 16 will be turned on, and the light-directing portion 26 of the rotation arm 20 will direct the light of the lamp portion 16 to various angles so as to make it easy for the users to identify.

FIG. 4b is a perspective diagram of the portable storage device 1 at a status of being housed. When the rotation arm 20 is rotated to the front of the main body 10 and covers the connection portion 12, the rotation arm 20 is situated at a first position for being housed, and the protruding portions of the third fastening portion 22 are engaged with the concave portions of the first fastening portion 122 so as to cover the connection portion 12. At this time, the portable storage device 1 is at the status of being housed. Because the portable storage device 1 is not being used, the lamp portion 16 is turned off.

It should be noticed that the position of the lamp portion 16 is not limited to the back portion 14 of the main body 10. Because the lamp portion 16 is turned on only when the storage device is being used, it is preferred to install the lamp portion 16 in the back portion 14 so that the light can be easily directed to various angles by the light-directing portion 26 of the rotation arm 20.

Furthermore, in this embodiment, the third fastening portion 22 is a plurality of protruding portions, and the first fastening portion 122 and the second fastening portion 142 are concave portions corresponding to the protruding portions, respectively. However, different designs can be applied to the fastening portions of the invention. For example, the third fastening portion 22 can be designed to be concave portions, and the first fastening portion 122 and the second fastening portion 142 are respectively protruding portions corresponding to the concave portions. Thus, the protruding portions are engaged with the concave portions in the same way so that the rotation arm 20 can be situated at the second position for being used or the first position for being housed.

In addition, the hanging-portion of the invention is not limited to the design of the hanging hole 24. As long as the rotation arm 20 can be rotated without obstruction, different designs can be applied to the hanging portion, such as a hanging hook or a hanging ring. By means of the hanging portions, it is convenient for the users to carry the portable storage devices with them when the storage devices are not being used. The hanging portion can be installed on the other positions of the portable storage device 1, such as the back portion 14 of the main body 10, as long as the rotation arm 20 can be rotated without obstruction.

Figure 5:
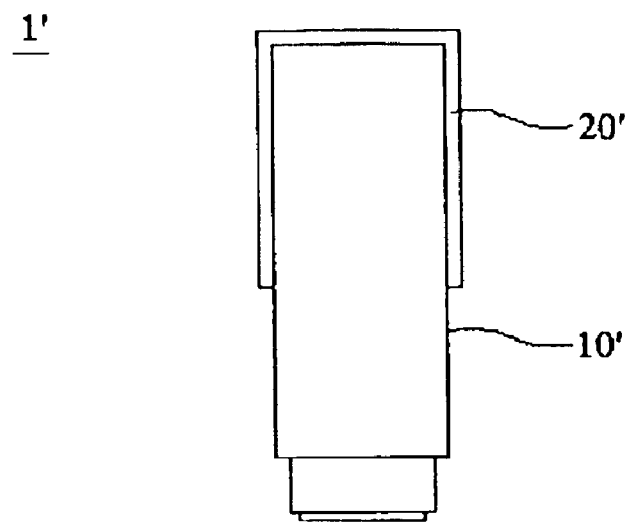
FIG. 5 is a perspective diagram of another embodiment of a portable storage device according to the present invention.
Figure 6:
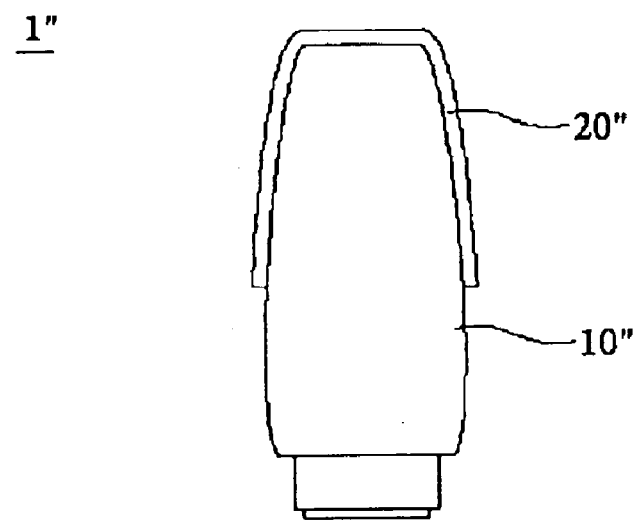
FIG. 6 is a perspective diagram of another embodiment of a portable storage device according to the present invention.

In this embodiment, the main body 10 is roughly in a hexagonal shape. The main point of the invention is that the rotation arm 20 can be rotated in relative to the main body 10 and be situated at the second position for being used or the first position for being housed. Therefore, various shapes having front and back portions roughly symmetrical to each other can be applied to the main body 10 as long as the rotation arm 20 can be rotated without obstruction. For example, the portable storage device 1' shown in FIG. 5 has a main body 10' with a rectangular shape, and the portable storage device 1" in FIG. 6 has a main body 10" with a streamline shape. As shown in FIG. 6, the front and back portions of the main body 100" are symmetrical to each other.

In the portable storage device of the present invention, the rotation arm 20 connected to the main body takes the place of the conventional covering, and therefore, a separated covering is avoided. Furthermore, by installing the light-directing device 26 on the rotation arm 20, the light of the lamp portion 16 can be directed to various angles when the storage device is being used, and the user can easily identify the light of the lamp portion 16 from various angles, and the misjudging can be avoided so that the portable storage device 1 will not be taken out when the data accessing is being performed. Therefore, the present invention can resolve the problems caused by the conventional USB portable disk drive.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A portable information storage device, comprising:
   a main body comprising a storage portion, a connection portion and a back portion, the connection portion having a first fastening portion, and the back portion having a second fastening portion; and
   a rotation arm rotatably connected to the main body, the rotation arm having a third fastening portion corresponding to the first fastening portion and the second fastening portion;
   wherein when the rotation arm is situated at a first position, the first fastening portion is engaged with the third fastening portion; when the rotation arm is situated at a second position, the second fastening portion is engaged with the third fastening portion.

2. The portable information storage device of claim 1, wherein the storage portion is a portable disk drive.

3. The portable information storage device of claim 1, wherein the connection portion is a universal serial bus (USB) connection portion.

4. The portable information storage device of claim 1, wherein the main body comprises a lamp portion, and the rotation arm comprises a light-directing portion.

5. The portable information storage device of claim 4, wherein the lamp portion is a light emitting diode (LED).

6. The portable information storage device of claim 1, wherein the third fastening portion is a plurality of protruding portions.

7. The portable information storage device of claim 6, wherein the first fastening portion and the second fastening portion are respectively concave portions corresponding to the protruding portions.

8. The portable information storage device of claim 1, wherein the third fastening portion is a plurality of concave portions.

9. The portable information storage device of claim 8, wherein the first fastening portion and the second fastening portion are respectively protruding portions corresponding to concave portions.

10. The portable information storage device of claim 1, wherein the rotation arm comprises a hanging portion.

11. The portable information storage device of claim 10, wherein the hanging portion comprises a plurality of hanging holes.

* * * * *